(12) United States Patent  (10) Patent No.: US 8,391,040 B2
Suzuki et al.  (45) Date of Patent: Mar. 5, 2013

(54) NONVOLATILE SEMICONDUCTOR MEMORY DEVICE

(75) Inventors: Yoshinao Suzuki, Yokohama (JP); Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 13/052,198

(22) Filed: Mar. 21, 2011

(65) Prior Publication Data

US 2011/0267864 A1 Nov. 3, 2011

(30) Foreign Application Priority Data

Apr. 30, 2010 (JP) ................................ 2010-105624

(51) Int. Cl.
  *G11C 5/02* (2006.01)
(52) U.S. Cl. ................. 365/51; 365/63; 365/52
(58) Field of Classification Search .............. 365/51, 365/52, 63
  See application file for complete search history.

(56) References Cited

U.S. PATENT DOCUMENTS

| 7,768,790 | B2 | 8/2010 | Kuroda et al. |
| 7,813,259 | B2 | 10/2010 | Kuroda et al. |
| 8,233,303 | B2 * | 7/2012 | Best et al. ............... 365/51 |

FOREIGN PATENT DOCUMENTS

JP 2009-277334 11/2009

* cited by examiner

*Primary Examiner* — Huan Hoang
(74) *Attorney, Agent, or Firm* — Oblon, Spivak, McClelland, Maier & Neustadt, L.L.P.

(57) ABSTRACT

According to one embodiment, a nonvolatile semiconductor memory device includes a first memory chip, a second memory chip, and a control chip. The first chip includes a first inductor configured to transmit/receive a signal, and a memory cell. The second chip is disposed on the first chip and includes a second inductor configured to transmit/receive a signal, and a memory cell. The control chip includes a control circuit configured to control the first and second chips, and a third inductor configured to transmit/receive a signal to/from the first and second inductors. The outer peripheries of the first and second inductors are included in a closed space produced by extending the outer periphery of the third inductor in a direction perpendicular to a plane that includes the third inductor. The inductance of the third inductor is greater than at least one of the inductances of the first and second inductors.

20 Claims, 11 Drawing Sheets

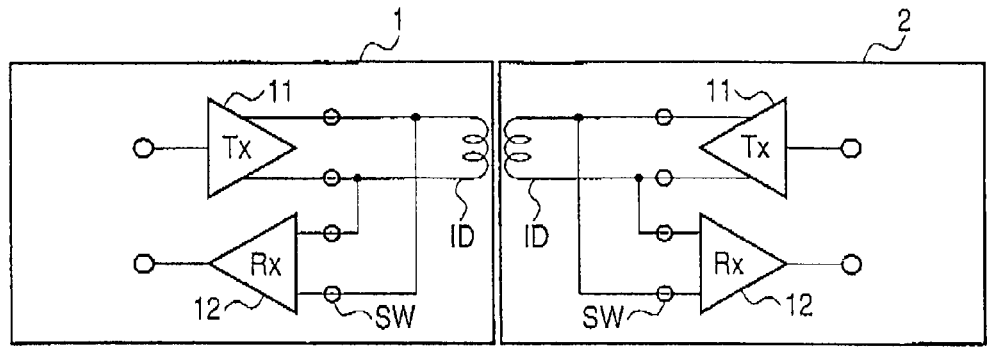
F I G. 3
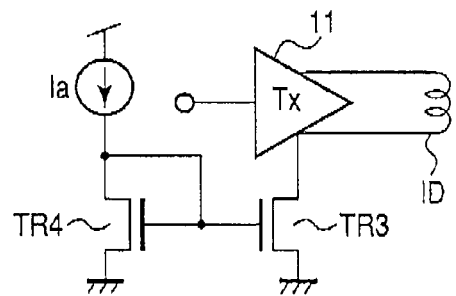
F I G. 4
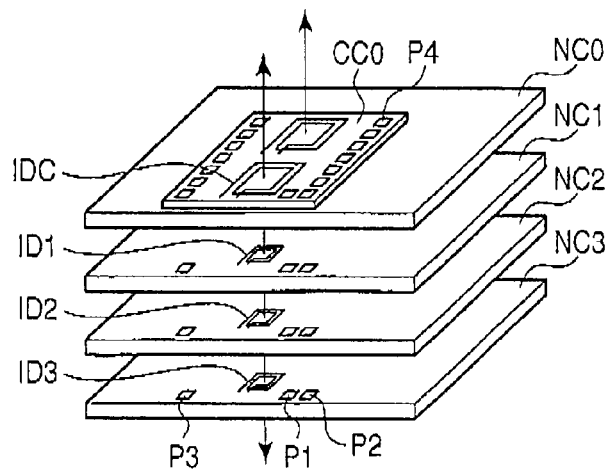
F I G. 5

| Input Cycle | I/O 7 | I/O 6 | I/O 5 | I/O 4 | I/O 3 | I/O 2 | I/O 1 | I/O 0 |
|---|---|---|---|---|---|---|---|---|
| 1 | A7 | A6 | A5 | A4 | A3 | A2 | A1 | A0 |
| | A13-A0 : Column Addresses ||||||||
| 2 | A15 | A14 | A13 | A12 | A11 | A10 | A9 | A8 |
| | Don't Care || A13-A0 : Column Addresses ||||||
| 3 | A23 | A22 | A21 | A20 | A19 | A18 | A17 | A16 |
| | Plane Addr | A22-A16 : Page Address |||||||
| 4 | A31 | A30 | A29 | A28 | A27 | A26 | A25 | A24 |
| | A24-A34 : Block Address (2048 Blocks/Plane); ||||||||
| 5 | | | A37 | A36 | A35 | A34 | A33 | A32 |
| | Don't Care || Chip Address ||| Block Address |||

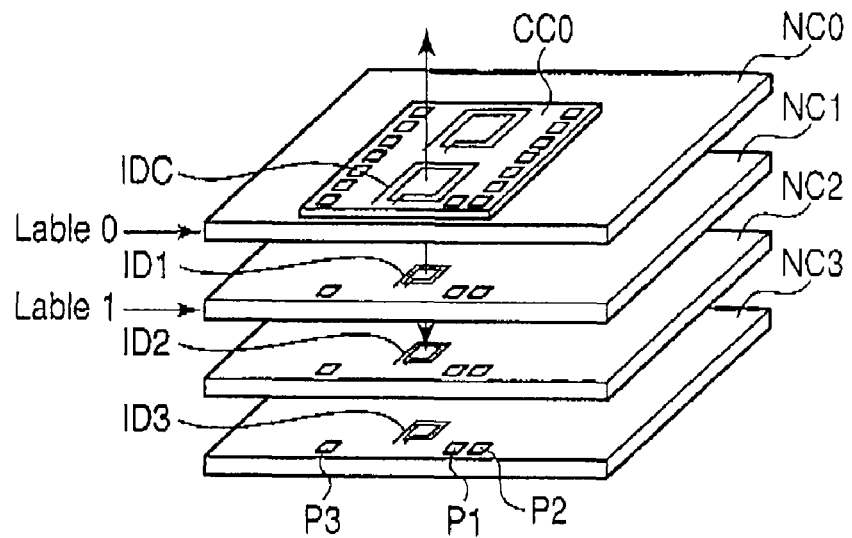
F I G. 10
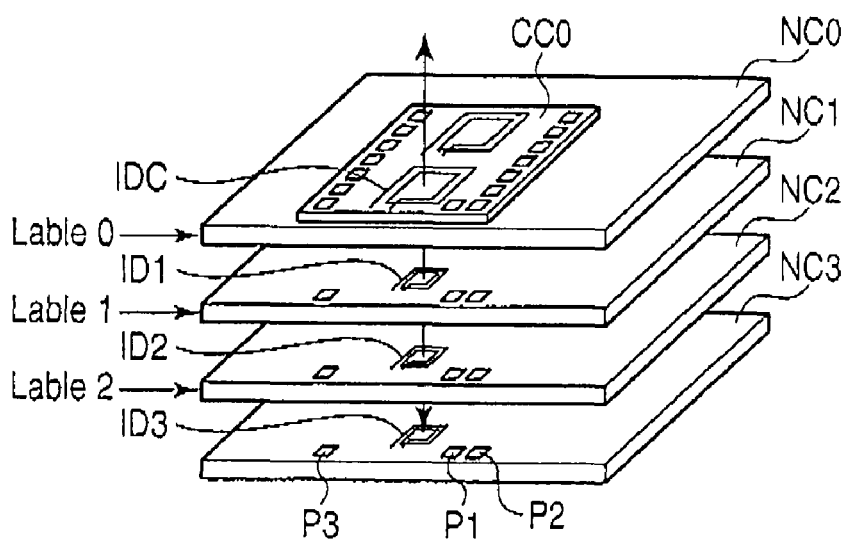
F I G. 11

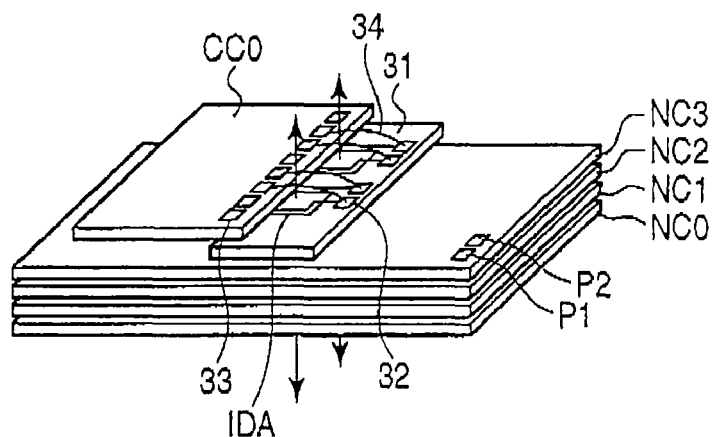
F I G. 14 A
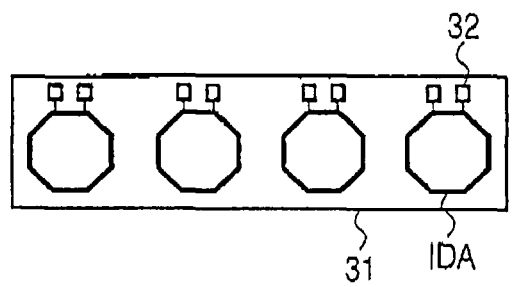
F I G. 14 B
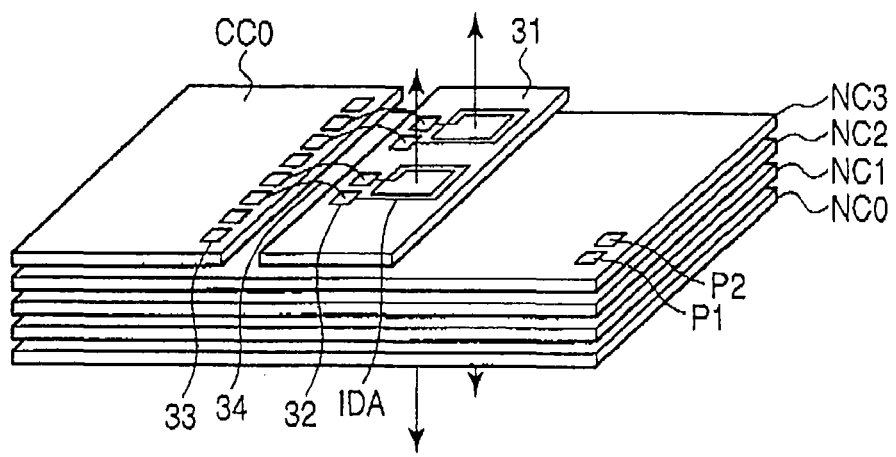
F I G. 15

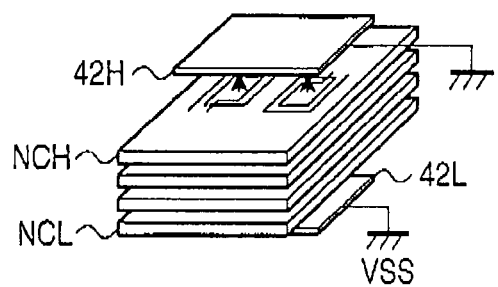
F I G. 1 8
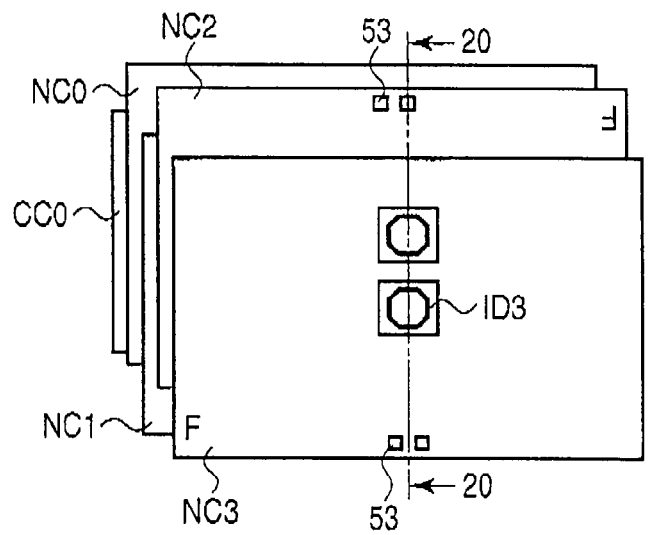
F I G. 1 9
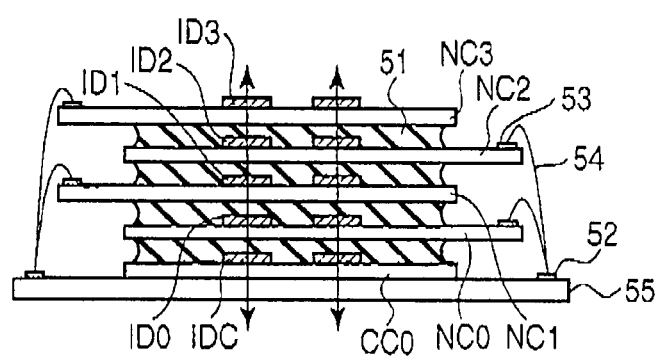
F I G. 2 0

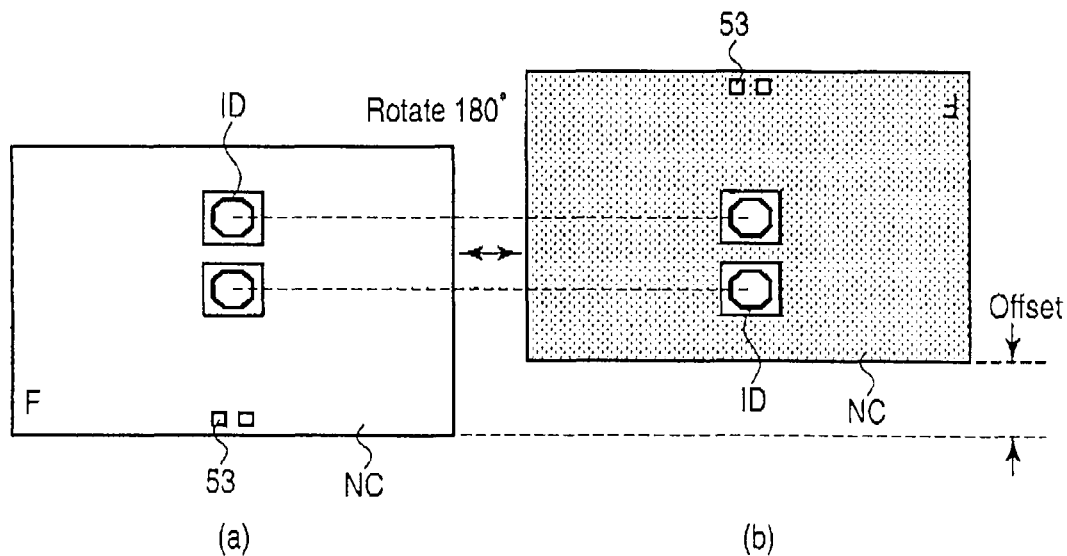
F I G. 2 1
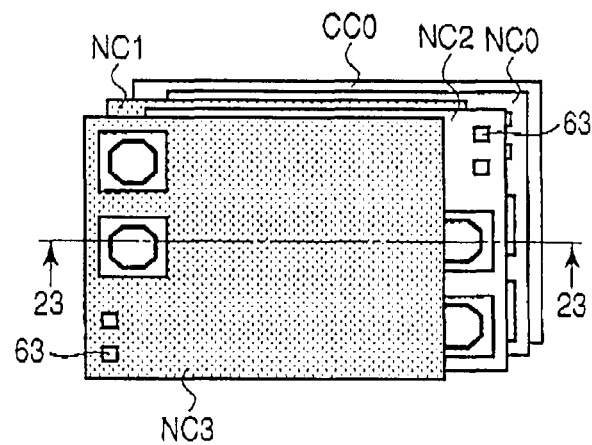
F I G. 2 2

NONVOLATILE SEMICONDUCTOR MEMORY DEVICE

CROSS-REFERENCE TO RELATED APPLICATIONS

This application is based upon and claims the benefit of priority from Japanese Patent Application No. 2010-105624, filed Apr. 30, 2010; the entire contents of which are incorporated herein by reference.

FIELD

Embodiments described herein relate generally to a nonvolatile semiconductor memory device which performs an inter-chip communication by use of an inductor element formed on a chip.

BACKGROUND

Recently, high-density mounting has been required for nonvolatile semiconductor memory devices as a result of a size reduction in portable electronic equipment. Accordingly, three-dimensional stack mounting in which semiconductor chips are stacked is drawing attention.

In such a three-dimensional memory device, signals are traditionally sent/received between chips by wire bonding. However, there is fear that a required number of wire bondings may not be permitted when a great number of chips need to be stacked in one package. Moreover, it is known that reflection of signals between wiring lines resulting from an inductor component of wires decreases the performance of an LSI.

To address this issue, there has been suggested a technique for forming a through-via that penetrates a substrate in a semiconductor chip, and a technique for forming a communication inductor element in a semiconductor chip.

However, a complicated manufacturing process is required for forming the through-via, so that there are problems of increased manufacturing costs and of the difficulty of improving quality. Another problem is that the area of the semiconductor chip increases if the inductor element is formed in the semiconductor chip.

BRIEF DESCRIPTION OF THE DRAWINGS

FIG. 3 is a circuit diagram of the transmission/receiving circuits provided in the stacked semiconductor chips according to the first embodiment;

FIG. 4 is a circuit diagram of another example of a transmission circuit according to the first embodiment;

FIG. 5 is a perspective view showing the structure of a nonvolatile semiconductor memory device according to the first embodiment;

FIG. 10 is a diagram showing the labeling of the semiconductor chips according to the first embodiment;

FIG. 11 is a diagram showing the labeling of the semiconductor chips according to the first embodiment;

FIGS. 14A and 14B are diagrams showing the structure of a nonvolatile semiconductor memory device according to a third embodiment;

FIG. 15 is a perspective view showing the structure of a nonvolatile semiconductor memory device according to a modification of the third embodiment;

FIG. 18 is a perspective view of a nonvolatile semiconductor memory device according to another modification of the fourth embodiment;

FIG. 19 is a diagram showing the structure of a nonvolatile semiconductor memory device according to a fifth embodiment;

FIG. 20 is a sectional view along the line 20-20 of FIG. 19;

FIG. 21 is a plan view showing the configuration of a NAND chip provided in the nonvolatile semiconductor memory device according to the fifth embodiment;

FIG. 22 is a diagram showing the structure of a nonvolatile semiconductor memory device according to a sixth embodiment;

DETAILED DESCRIPTION

Hereinafter, embodiments will be described with reference to the drawings. In the description, like reference signs are provided to like parts throughout the drawings.

In general, according to one embodiment, a nonvolatile semiconductor memory device includes a first memory chip, a second memory chip, and a control chip. The first memory chip includes a first inductor element configured to transmit/receive a signal, and a memory cell. The second memory chip is disposed on the first memory chip and includes a second inductor element configured to transmit/receive a signal, and a memory cell. The control chip includes a control circuit configured to control the operations of the first and second memory chips, and a third inductor element configured to transmit/receive a signal to/from the first and second inductor elements. The outer peripheries of the first and second inductor elements are included in a closed space produced by extending the outer periphery of the third inductor element in a direction perpendicular to a plane that includes the third inductor element. The inductance of the third inductor element is greater than at least one of the inductances of the first and second inductor elements.

[1] First Embodiment

In the first embodiment, the basic configuration of a nonvolatile semiconductor memory device is described.

[1-1] Principle of Transmission/Receiving Circuits

The nonvolatile semiconductor memory device according to the first embodiment has a three-dimensional stack structure in which semiconductor chips are stacked. Each of the stacked semiconductor chips includes transmission/receiving circuits (communication circuits).

Figure 1:
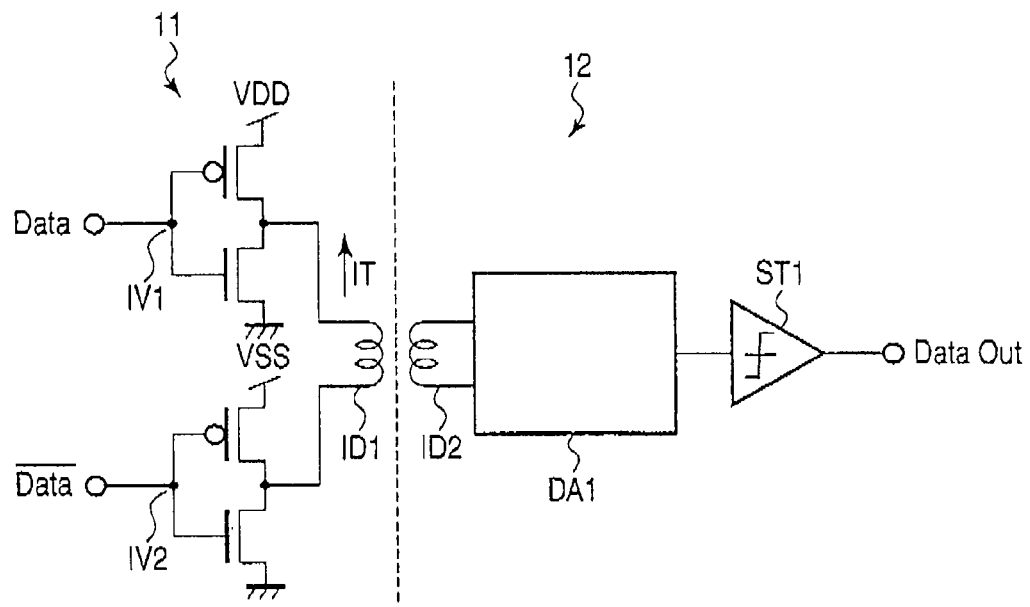
FIG. 1 is a circuit diagram of transmission/receiving circuits provided in a semiconductor chip according to a first embodiment.

FIG. 1 is a circuit diagram of the transmission/receiving circuits provided in the semiconductor chip according to the first embodiment.

As shown in FIG. 1, each of the semiconductor chips has the transmission/receiving circuits (a transmission circuit 11 and a receiving circuit 12) for performing a communication between the semiconductor chips. Inductor elements ID1 and ID2 are disposed at the same position in the stacked semiconductor chips that face each other.

The transmission circuit 11 comprises two inverter circuits IV1 and 1V2, and the inductor element ID1. The inductor element ID1 is connected between the output terminals of the two inverter circuits IV1 and IV2.

Complementary signals (Data, /Data) corresponding to data are input to the input terminals of the inverter circuits IV1 and IV2, respectively. The signal /Data represents a signal complementary to the signal Data. A power supply voltage VDD or a reference voltage (e.g., ground voltage) Vss is supplied to the power supply terminals of the inverter circuits IV1 and IV2.

The transmission circuit 11 is activated when data is changed, and the transmission circuit 11 passes a current through the inductor element ID1. Inductive coupling is generated between the inductor element ID1 and the inductor element ID2 on the side of the receiving circuit 12 by the change of a magnetic field caused by the change of the current running through the inductor element ID1.

As shown in FIG. 1, the receiving circuit 12 comprises the inductor element ID2, a differential amplifier DA1, and a Schmitt trigger circuit ST1. The receiving circuit 12 converts, to a current, a magnetic field generated in the inductor element ID2 by the inductive coupling. This current is extremely weak and thus has to be amplified by the differential amplifier DA1. Both ends of the inductor element ID2 serve as the inputs for the differential amplifier DA1 to amplify the change of the current on the side of the transmission circuit 11. In this case, the inputs of the differential amplifier DA1 are biased to an intermediate potential.

The Schmitt trigger circuit ST1 retains an instantaneous peak voltage on the side of the receiving circuit 12 generated when data on the side of the transmission circuit 11 changes. The receiving circuit 12 restores data on the side of the transmission circuit 11.

[1-2] Operation of the Transmission/Receiving Circuits

An operation example of the transmission/receiving circuits according to the first embodiment is described. When input data in the transmission circuit 11 changes from 0 to 1, a current IT runs through the inductor element ID1 in a direction shown in FIG. 1. An upward magnetic field is generated in the inductor element ID1 by the instantaneous current IT. A change of this magnetic field appears as a potential difference at both ends of the inductor element ID2 on the side of the receiving circuit 12. This weak signal is provided to the input terminal of the differential amplifier DA1, and amplified to a level that can be detected by the Schmitt trigger circuit ST1.

Figure 2:
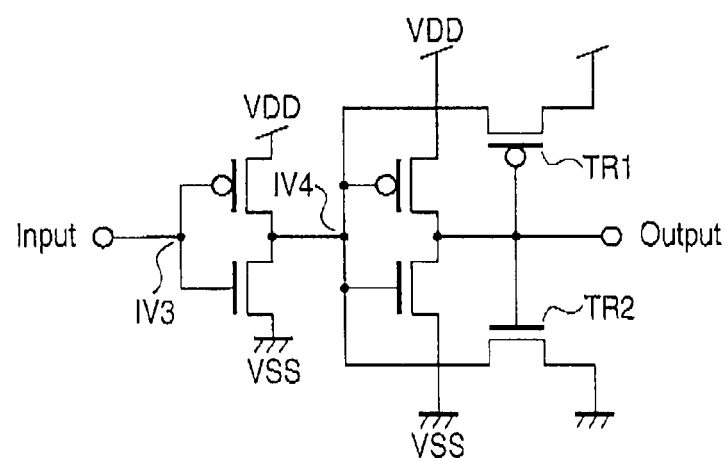
FIG. 2 is a circuit diagram of a Schmitt trigger circuit according to the first embodiment.

A two-stage amplifier circuit configuration shown in FIG. 2 is used for the Schmitt trigger circuit ST1. The Schmitt trigger circuit ST1 comprises inverter circuits IV3 and IV4, and transistors TR1 and TR2. This configuration enables the improvement of the response of the receiving circuit 12 and the detection of an instantaneous voltage change.

[1-3] Configuration of Transmission/Receiving Circuits

Now, the configuration of the transmission/receiving circuits provided in the semiconductor chip is described.

The magnetic field in the inductor element ID2 generated by the inductor element ID1 on the side of the transmission circuit decreases in proportion to the cube of the distance between the inductor element ID1 and the inductor element 102. Therefore, a certain size of the inductor element is required to ensure an inter-chip communication. However, this leads to an increase of chip area.

Accordingly, this problem is solved by using a common inductor element ID for the transmission circuit 11 and the receiving circuit 12 in semiconductor chips 1 and 2 as shown in FIG. 3 and adding a mechanism for activating one of the transmission circuit and the receiving circuit on the chip.

For example, switch circuits SW can be used as the mechanisms for activating one of the transmission circuit and the receiving circuit. The switch circuits SW are disposed between the inductor element ID and the transmission circuit 11 and between the inductor element ID and the receiving circuit 12.

In transmission from the semiconductor chip 1 to the semiconductor chip 2, the switch circuit SW between the inductor element ID and the transmission circuit 11 is closed, and the switch circuit SW between the inductor element ID and the receiving circuit 12 is open in the semiconductor chip 1. In the semiconductor chip 2, the switch circuit SW between the inductor element ID and the receiving circuit 12 is closed, and the switch circuit SW between the inductor element ID and the transmission circuit 11 is open.

On the other hand, in transmission from the semiconductor chip 2 to the semiconductor chip 1, the switch circuit SW between the inductor element ID and the transmission circuit 11 is closed in the semiconductor chip 2, and the switch circuit SW between the inductor element ID and the receiving circuit 12 is closed in the semiconductor chip 1. The other switch circuits SW are open.

In FIG. 1, the inductive coupling generated between the inductor elements ID1 and ID2 can penetrate a substrate or wiring lines in the chip. The distance of a communication performed by the inductive coupling is substantially equal to the diameter of the inductor element.

Thus, by increasing the size of the inductor element and reducing the inter-chip distance, the communication distance can be increased, and an inter-chip coupling coefficient can be improved at the same time. This enables a communication with a remote chip, that is, a communication between stacked chips. In performing a communication, target chips are only activated, and other chips are deactivated.

Furthermore, a potential difference V generated between both ends of the inductor element ID2 on the side of the receiving circuit 12 is provided by V=L·(dI/dt) wherein L is the inductance of the inductor element ID1 on the side of the transmission circuit 11, and I is a current running through the inductor element ID1 on the side of the transmission circuit 11.

The circuit configuration of the transmission circuit 11 shown in FIG. 4 enables the improvement of transmission power. When a communication is performed between chips, power consumption can be reduced by adjusting the amount of a current.

In the transmission circuit shown in FIG. 4, a transistor TR3 is connected between the transmission circuit 11 and the reference voltage Vss. Moreover, the gate and drain of a transistor TR4 are connected to the gate of the transistor TR3, and a current source Ia is connected to the gate and drain of the transistor TR4. The reference voltages Vss are supplied to the sources of the transistors TR3 and TR4, respectively.

[1-4] Configuration of the Nonvolatile Semiconductor Memory Device

[1-4-1] Stack structure of the Semiconductor Chips

In the case shown here, a data communication is performed between semiconductor chips, for example, four stacked NAND chips. A small inductor element formed by spirally winding the metal wiring lines of a chip is used for an inter-chip communication performed by the inductive coupling. Thus, there are substantially no additional costs.

In a basic configuration for a wireless communication technique enabled by the inductive coupling shown in the present embodiment, NAND chips NC0, NC1, NC2, and NC3 and a control chip CC0 are stacked, and inductor elements ID0 (not shown), ID1, ID2, ID3, and IDC are disposed at corresponding positions of the chips in the chip stacking direction, as shown in FIG. 5. A communication is then performed between the inductor elements of the chips.

A NAND flash memory including memory cells formed in each of the NAND chips NC0 to NC3. Although the NAND chips in which the NAND flash memories are formed are shown by way of example here, chips in which other kinds of memories are formed may be used. A controller for controlling the operation of the NAND chips is formed in the control chip CC0.

As shown in FIG. 5, the four NAND chips NC0, NC1, NC2, and NC3 are stacked in descending order. The control chip CC0 is disposed on the NAND chip NC0.

The NAND chip NC0 has the NAND flash memory and the inductor element ID0 (not shown) as well as pads P1, P2 and P3. The reference voltage (e.g., ground voltage) Vss is supplied to the pad P1, and the power supply voltage VDD is supplied to the pad P2. A chip enable signal CE is input to the pad P3.

Similarly, the NAND chip NC1 has the NAND flash memory, the inductor element ID1, and pads P1, P2 and P3. The NAND chip NC2 has the NAND flash memory, the inductor element ID2, and pads P1, P2 and P3. The NAND chip NC3 has the NAND flash memory, the inductor element ID3, and pads P1, P2 and P3.

Furthermore, the control chip CC0 has the controller (not shown), the inductor element IDC, and pads P1, P2, P3, and P4. Signals are input/output between the pad P4 and an external circuit.

The inductor elements ID0, ID1, ID2, ID3, and IDC respectively disposed in the NAND chips NC0, NC1, NC2, and NC3 and the control chip CC0 are located at the corresponding positions in the chip stacking direction. Specifically, the centers of openings in the inductor elements ID0 to ID3, and ID0 are arranged to be on the same line in the stacking direction. Alternatively, the outer peripheries of the inductor elements ID0 to ID3 are included in a closed space produced by extending the outer periphery of the inductor element IDC in a direction perpendicular to a plane that includes the inductor element IDC.

Bonding wires are respectively formed between the pads P1, P2 and P3 of each NAND chip and the pads P1, P2 and P3 of the control chip CC0. The pads P1, the pads P2, and the pads P3 are electrically connected to each other, respectively.

A voltage V generated in the inductor element on the side of the receiving circuit during a communication is represented by V=M·(dI/dt) wherein M is mutual inductance that is M-k(LNAND·LCTRL)$^{1/2}$ in which LNAND is the inductance of the inductor element of the NAND chip and LCTRL is the inductance of the inductor element of the control chip, and I is a current running through the inductor element on the side of the transmission circuit.

Thus, higher mutual inductance between the inductor elements is desired to ensure the inter-chip communication. However, in a general-purpose memory, the size of a peripheral circuit needs to be minimized. Therefore, according to the present embodiment, the size of the inductor element of the control chip is greater than the size of the inductor element of the NAND chip so that the area of the NAND chip is not increased by the formation of the inductor element. That is, the size of the inductor element of the control chip is increased without increasing the size of the inductor element of the NAND chip, and the mutual inductance between the inductor elements is thereby increased.

Furthermore, a common inductor element is used for the transmission circuit and the receiving circuit formed in one chip, and the connection of this inductor element is switched to the transmission circuit or the receiving circuit by an enable signal, such that the increase of the area attributed to the formation of the inductor element is inhibited.

[1-4-2] Layout of the Inductor Element

The inductor element can be disposed at any position in the chip in contrast with a bonding pad. This means that a center pad which can be disposed at equal distances from memory blocks (or memory planes) in the chip is obtained. Disposing the inductor element in the middle of the memory blocks contributes to the improvement of the performance of a NAND memory.

As long as the peripheral circuits are not affected by crosstalk caused by the passage of a current through the inductor element when data is transmitted/received, the inductor element for performing a communication by the inductive coupling can be disposed at an optimum position on the chip, for example, the peripheral portion or center of the chip.

Figure 6:
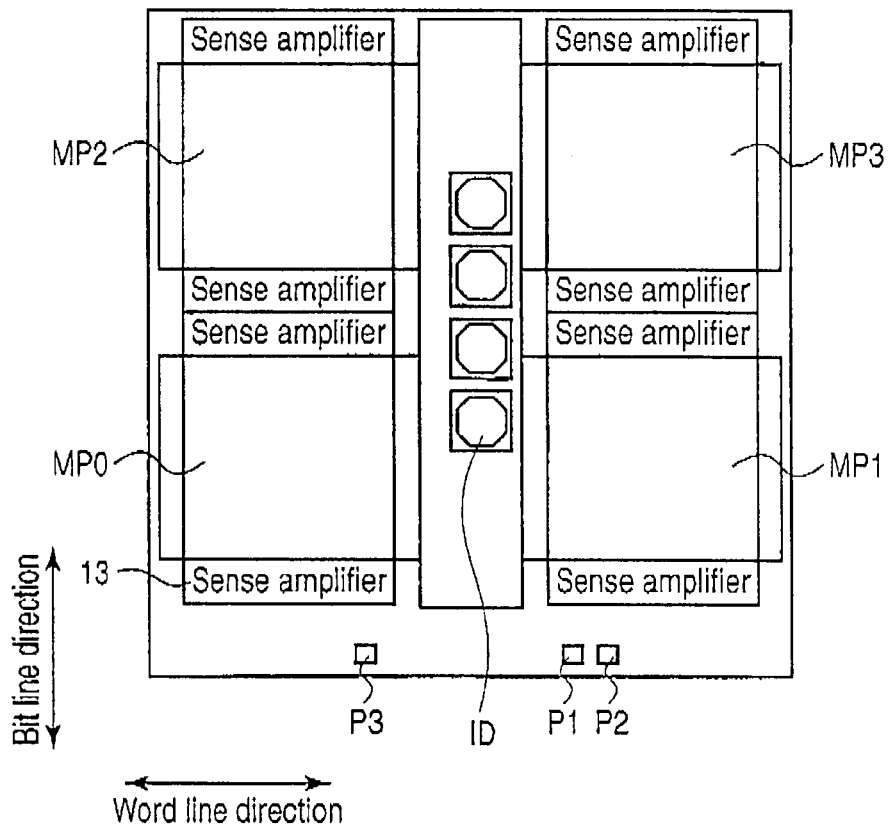
FIG. 6 is a diagram showing a layout of inductor elements in the semiconductor chip according to the first embodiment.

FIG. 6 is a diagram showing an example of the arrangement of inductor elements in the center of the semiconductor chip.

A memory plane MP0 is disposed in the lower left of the semiconductor chip, and a memory plane MP1 is disposed in the lower right. A memory plane MP2 is disposed in the upper left, and a memory plane MP3 is disposed in the upper right. Sense amplifiers 13 are disposed in the upper and lower parts of each of the memory planes MP0 to MP3.

Inductor elements ID are arranged in the center of the semiconductor chip, that is, between the memory planes MP0, MP2 and the memory planes MP1, MP3. The pads P1, P2 and P3 are arranged under the memory planes MP0 and MP1.

As shown in FIG. 6, in order to have an optimum layout in a memory device in which memory cells are arranged, the inductor element ID is disposed in the vicinity of the sense amplifiers for sending/receiving data to/from the memory cells. The inductor element ID is disposed at equal distances and as close to the sense amplifiers 13 as possible, such that the influence of a wiring delay in data transmission can be reduced.

Figure 7:
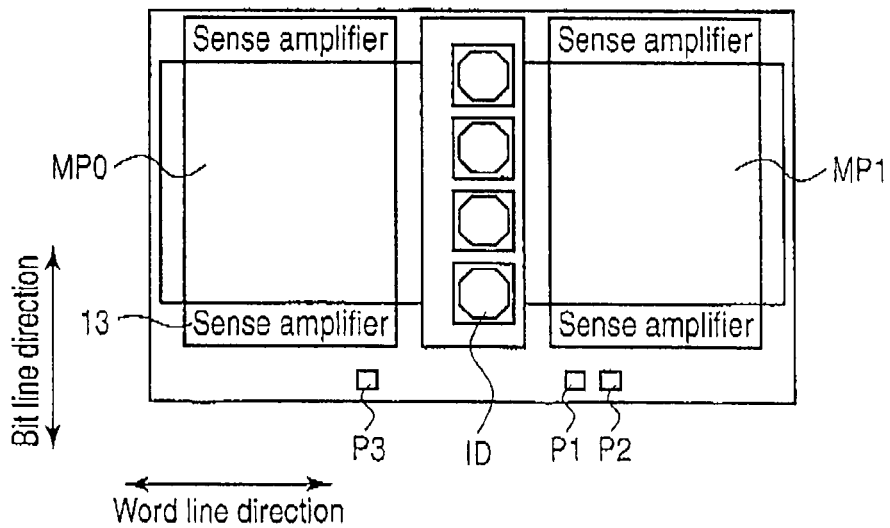
FIG. 7 is a diagram showing another layout of the inductor elements in the semiconductor chip according to the first embodiment.

When two memory planes MP0 and MP1 are disposed in the semiconductor chip, the inductor elements ID are also arranged between the memory planes MP0 and MP1 as shown in FIG. 7.

One inductor element ID, or two, three, or four or more inductor elements ID may be arranged in the semiconductor chip. The number of inductor elements arranged in the NAND chip is equal to the number of inductor elements arranged in the control chip. A higher-speed interface can be obtained by arranging inductors on the same chip as long as the area of the semiconductor chip permits. Moreover, the configuration of the NAND memory is not limited to the example described above. For example, the sense amplifiers can be arranged in one of the upper part and lower part of the memory plane.

For example, assume that the communication speed per input/output pad of a general NAND memory is 100 Mbit/sec and that 8 communication channels (pads) are used for sending/receiving data between chips. Here, if the communication speed per inductor element according to the present embodiment is 400 Mbit/sec, six input/output pads for communication can be eliminated, and a communication can be performed by two input/output pads (inductor elements). In this case, the control chip CC0 performs parallel-serial conversion (I2C: inter-integrated circuit) of data to be communicated.

[1-4-3] Structure of the Inductor Element

Figures 8, 9:
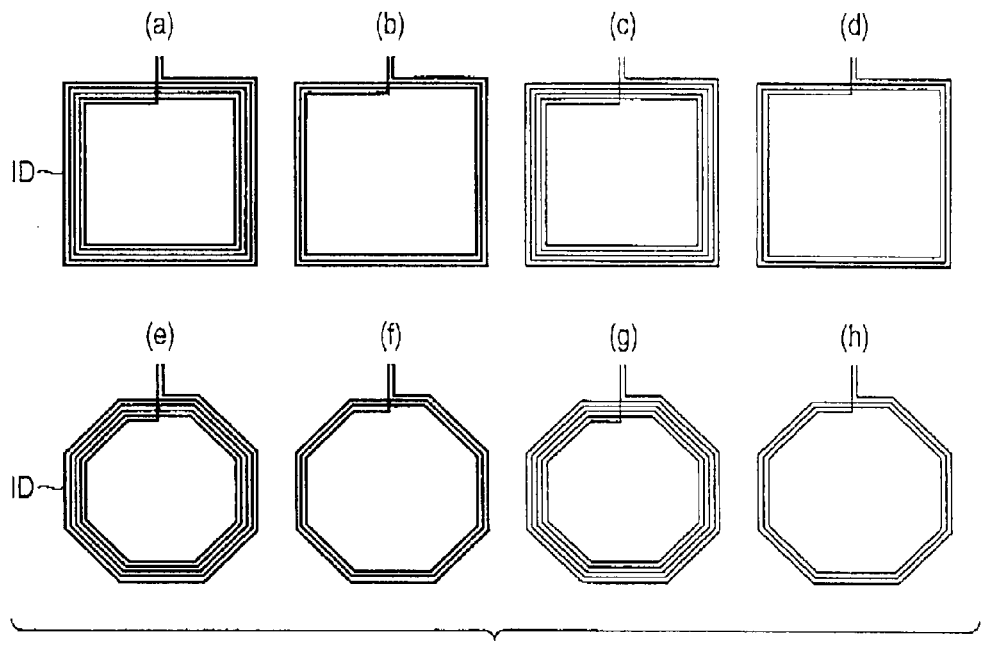
FIG. 8 is a diagram showing the structure of the inductor element according to the first embodiment.
FIG. 9 is a diagram showing communication protocols in a NAND memory.

FIG. 8 is a diagram showing the structure of the inductor element according to the first embodiment.

The inductor element may have, for example, a quadrangle shape including a square shape as indicated by (a) to (d) shown in FIG. 8, or an octagonal shape as indicated by (e) to (h) shown in FIG. 8. The inductor element may otherwise have some other polygonal shape or a circular shape.

For example, the following conducting wires are used to constitute the inductor element ID: a conducting wire in which the number of winds is 5 and the width is 2 μm as indicated by (a) and (e) shown in FIG. 8, a conducting wire in which the number of winds is 3 and the width is 2 μm as indicated by (b) and (f) shown in FIG. 8, a conducting wire in which the number of winds is 5 and the width is 1 μm as indicated by (c) and (g) shown in FIG. 8, and a conducting wire in which the number of winds is 3 and the width is 1 μm as indicated by (d) and (h) shown in FIG. 8. The distance between the conducting wires of the inductor element is, for example, 0.5 μm.

Furthermore, the sizes of the square inductor elements indicated by (a) and (d) shown in FIG. 8 are for example, 120 μm×120 μm. The sizes of the quadrangle shapes enclosing the octagonal inductor elements indicated by (e) and (h) shown in FIG. 8 are, for example, 120 μm×120 μm.

In the case of the square inductor element, the length D of one side of each of the square transmission coil (inductor element) and reception coil (inductor element) is equal to 50 μm, and an inter-chip distance X is equal to 50 μm. An interference-to-signal ratio (ISR) [dB] for the distance (inter-channel distance) Y [μm] between the inductor elements is then found. In this case, crosstalk is minimized at Yo≈70 μm.

The inductor element ID is formed, for example, by using a wiring layer for forming a semiconductor circuit in the semiconductor chip. That is, the inductor element of the NAND chip is formed by using a wiring layer for forming a memory cell of the NAND chip. The inductor element of the control chip is formed by using a wiring layer for forming the controller.

When the inductor element is thus formed by using the manufacturing process of the chip, there is no need to add a new manufacturing process, and the rise of manufacturing costs can be inhibited.

[1-4-4] Operation of the Transmission/Receiving Circuits

An existing NAND memory uses input/output pads (eight input/output pads in the example shown in FIG. 9) to which conducting wires are connected and thereby sends/receives addresses and data.

According to the present embodiment, the transmission/receiving circuits including the inductor element shown in FIG. 3 are used to send/receive addresses and data. The operation of the transmission/receiving circuits including the inductor element is checked by a circuit simulator "HSPICE (registered trademark)". According to this simulation, the communication speed per inductor element is 400 Mbit/sec. This speed is ten times or more the communication speed per input/output pad to which the existing conducting wire is connected.

According to the present embodiment, a high-speed interface can be obtained by using more than one inductor element, as shown in FIG. 6 and FIG. 7. Moreover, a parallel signal can be converted (I2C: inter-integrated circuit) to a serial signal by the control chip to reduce the number of inductor elements.

When the wireless communication enabled by the inductive coupling of the inductor elements is used, the bonding wires for power supply lines, for controlling a start from a standby mode, and for chip addresses cannot be eliminated, but the bonding wires can be reduced to several bonding wires per chip. This is highly advantageous to the mounting of a solid state drive (SSD) in one-chip package.

In a communication protocol, a signal is transmitted from the control chip to each NAND chip in the order of a column address, a page address, a block address, and a chip address, under the following rule shown in FIG. 9, as in the existing NAND memory. A corresponding chip then performs sending/receiving (reading/writing) in accordance with the instruction command, and other chips are set in a disable mode. When the sending/receiving (reading/writing) is finished, all of the chips are set in a standby mode by a start control signal from the bonding wire.

The chips are assigned by a chip address (CADD) pin as in the existing NAND memory. Alternatively, the intensity (a current passed through the inductor element) of a signal transmitted from the control chip before shipment is gradually increased, and the NAND chips which have received the signal sequentially send back reply signals ACK and are labeled.

Here, a magnetic field H generated by the inductor element decreases in proportion to the cube of the distance from the inductor element, so that the NAND chips NC0 to NC3 are labeled in order. The magnetic field H is represented by $H = I \cdot S/(4\pi D^3)$. I indicates a current generated in the inductor element, S indicates the area (size) of the inductor element, and D indicates the distance from the inductor element. It is considered that the magnetic field decreases in proportion to the cube of the distance, and shielding during packaging is therefore not needed.

Now, labeling of the stacked NAND chips is described in detail.

For example, when "Label 1" is provided to the NAND chip NC1, a signal of strength that can be received by the inductor element ID1 of the NAND chip NC1 is transmitted from the inductor element IDC of the control chip CC0, as shown in FIG. 10. The signal transmitted from the control chip CC0 at this moment has the strength that does not reach the NAND chip NC2.

The NAND chip NC1 which has received the signal from the control chip CC0 sends back the reply signal ACK to the control chip CC0, and labels itself (the NAND chip NC1) (the NAND chip NC1=Label 1).

At this moment, the NAND chip NC0 is already labeled in a similar manner. The labeled NAND chip NC0 does not make a reply to the signal from the control chip CC0.

Next, when "Label 2" is provided to the NAND chip NC2, a signal of strength that can be received by the inductor element ID2 of the NAND chip NC2 is transmitted from the inductor element IDC of the control chip CC0, as shown in FIG. 11. The signal transmitted from the control chip CC0 at this moment has the strength that does not reach the NAND chip NC3.

The NAND chip NC2 which has received the signal from the control chip CC0 sends back the reply signal ACK to the control chip CC0, and labels itself (the NAND chip NC2) (the NAND chip NC2=Label 2).

The remaining NAND chip NC3 is also provided with "Label 3" in a similar manner.

The labeling of the NAND chips is described below with a flowchart in FIG. 12.

Figure 12:
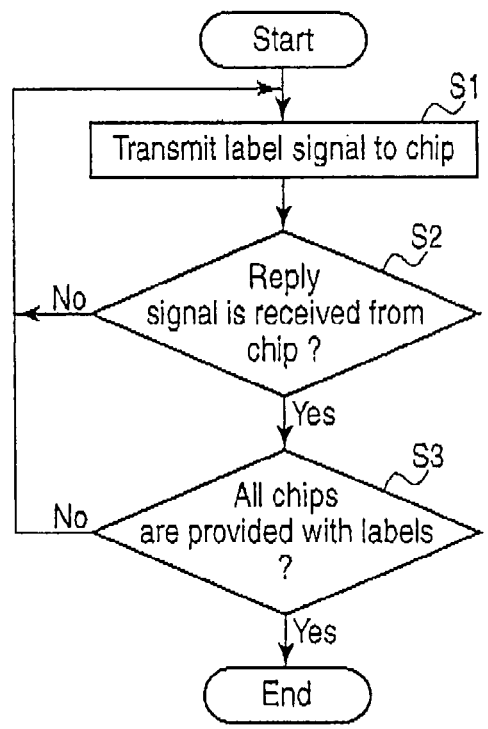
FIG. 12 is a flowchart showing a processing procedure of the labeling of the semiconductor chips according to the first embodiment.

FIG. 12 is a flowchart showing a processing procedure of the labeling of the NAND chips.

First, the control chip CC0 transmits a label signal for labeling the NAND chip to the inductor element of the NAND chip from the inductor element IDC (step S1).

Furthermore, the control chip CC0 judges whether a reply signal ACK is received from a target NAND chip (step S2).

When no reply signal ACK is received, the control chip CC0 returns to step S1, and again transmits a label signal to the target NAND chip. On the other hand, when the reply signal ACK is received, the control chip CC0 judges whether all of the NAND chips are provided with labels (step S3).

When all of the NAND chips are not provided with labels, the control chip CC0 returns to step S1, and again transmits label signals to the NAND chips which are not provided with labels. The processes from steps S1 to S3 are repeated.

When all of the NAND chips are provided with labels, the process of labeling is finished.

By labeling each of the NAND chips in accordance with the processing procedure in the above-mentioned flowchart, the chips on the control chip and on the NAND chips that are used for the labeling of the NAND chips NC0 to NC3 are not needed any more.

[2] Second Embodiment

In a nonvolatile semiconductor memory device described according to the second embodiment, semiconductor chips (a control chip and NAND chips) are stacked on a package substrate having inductor elements.

[2-1] Configuration of the Nonvolatile Semiconductor Memory Device

Figure 13A:
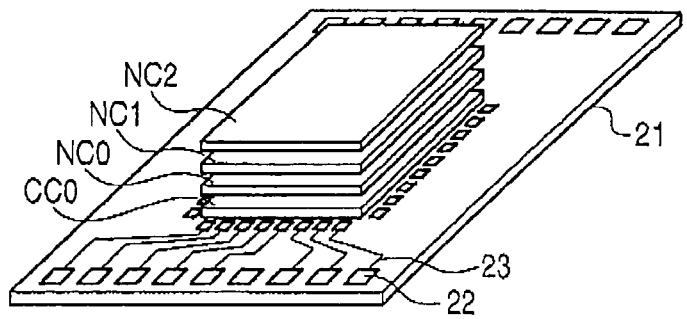
FIGS. 13A and 13B are perspective views showing the structure of a nonvolatile semiconductor memory device according to a second embodiment.
Figure 13B:
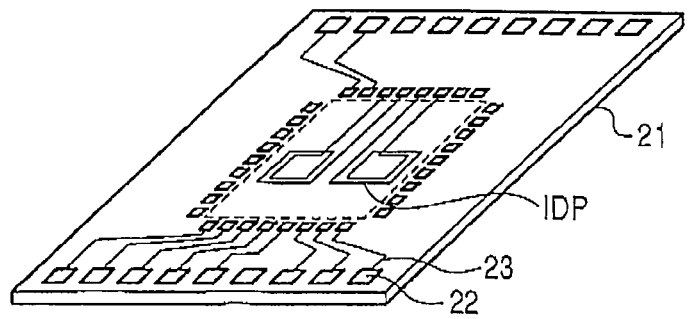

FIGS. 13A and 13B are perspective views showing the structure of the nonvolatile semiconductor memory device according to the second embodiment. FIG. 13A shows the structure of the nonvolatile semiconductor memory device in which the semiconductor chips are stacked on the package substrate. FIG. 13B shows the layout of the inductor elements and pads formed in the package substrate.

As shown in FIG. 13A, the nonvolatile semiconductor memory device according to the second embodiment comprises a package substrate 21, a control chip CC0, and NAND chips NC0, NC1, and NC2.

The control chip CC0, and the NAND chips NC0, NC1, and NC2 are stacked on the package substrate 21 in ascending order. The control chip CC0, and the NAND chips NC0, NC1, and NC2 each have an inductor element.

As shown in FIG. 13B, an inductor element IDP, a pad 22, and a lead frame 23 are formed on the package substrate 21.

The inductor elements formed in the package substrate 21, the control chip CC0, and the NAND chips NC0, NC1, and NC2 are disposed at corresponding positions in the chip stacking direction. Specifically, the centers of openings in the inductor elements are arranged to be on the same line in the stacking direction. Alternatively, the outer peripheries of the inductor elements formed in the control chip CC0, and the NAND chips NC0, NC1, and NC2 are included in a closed space produced by extending the outer periphery of the inductor element IDP in a direction perpendicular to a plane that includes the inductor element IDP.

In other respects, the configuration and operation of the nonvolatile semiconductor memory device according to the second embodiment are similar to those described in the first embodiment.

[3] Third Embodiment

In a nonvolatile semiconductor memory device described according to the third embodiment, a chip in which an inductor element is formed (hereinafter, an inductor chip), and a control chip in which a controller is formed are prepared, and these chips are arranged on stacked NAND chips.

[3-1] Configuration of the Nonvolatile Semiconductor Memory Device

FIGS. 14A and 14B are views showing the structure of the nonvolatile semiconductor memory device according to the third embodiment. FIG. 14A is a perspective view of the nonvolatile semiconductor memory device in which an inductor chip 31 and a control chip CC0 are arranged on stacked NAND chips. FIG. 14B is a plan view of the inductor chip 31 in which inductor elements are formed.

As shown in FIG. 14A, the nonvolatile semiconductor memory device according to the third embodiment comprises the control chip CC0, the inductor chip 31, and NAND chips NC0, NC1, NC2, and NC3.

The NAND chips NC0, NC1, NC2, and NC3 are stacked in ascending order. The inductor chip 31 is disposed on the NAND chip NC3, and the control chip CC0 is disposed on the inductor chip 31.

The inductor chip 31 has an inductor element IDA, and each of the NAND chips NC0, NC1, NC2, and NC3 has an inductor element. The inductor elements formed in the inductor chip 31 and the NAND chips NC0, NC1, NC2, and NC3 are disposed at corresponding positions in the chip stacking direction. Specifically, the centers of openings in the inductor elements are arranged to be on the same line in the stacking direction. Alternatively, the outer peripheries of the inductor elements formed in the NAND chips NC0 to NC3 are included in a closed space produced by extending the outer periphery of the inductor element IDA in a direction perpendicular to a plane that includes the inductor element IDA.

A pad 32 on the inductor chip 31 is connected to a pad 33 on the control chip CC0 by a bonding wire 34. Pads P1 and P2 are formed on the NAND chips NC0 to NC3. A reference voltage (e.g., ground voltage) Vss is supplied to the pad P1, and a power supply voltage VDD is supplied to the pad P2.

As shown in FIG. 14B, the inductor elements IDA are formed at predetermined intervals on the inductor chip 31. The pad 32 connected to the inductor element IDA is formed in the vicinity of the inductor element IDA. The material of the inductor chip 31 may be silicon or a resin.

Now, a nonvolatile semiconductor memory device according to a modification of the third embodiment is described.

FIG. 15 is a perspective view showing the structure of the nonvolatile semiconductor memory device according to the modification of the third embodiment.

The NAND chips NC0, NC1, NC2, and NC3 are stacked in ascending order. The inductor chip 31 and the control chip CC0 are arranged on the NAND chip NC3 without overlapping each other. That is, this modification is different from the example shown in FIG. 14A in that the control chip CC0 is not disposed on the inductor chip 31 but disposed on the NAND chip NC3.

The inductor chip 31 and the NAND chips NC0 to NC3 each have an inductor element. The inductor elements formed in the inductor chip 31 and the NAND chips NC0 to NC3 are disposed at corresponding positions in the chip stacking direction. Specifically, the centers of openings in the inductor elements are arranged to be on the same line in the stacking direction.

In other respects, the configuration and operation of the nonvolatile semiconductor memory device according to the third embodiment and the modification are similar to those described in the first embodiment.

The thickness in the chip stacking direction can be smaller in the structure shown in FIG. 15 than in the structure shown in FIG. 14A, which is advantageous to the reduction of the thickness of the memory device.

[4] Fourth Embodiment

In a nonvolatile semiconductor memory device described according to the fourth embodiment, a control chip in which an inductor element and a controller are formed is disposed between stacked NAND chips.

[4-1] Configuration of the Nonvolatile Semiconductor Memory Device

Figure 16:
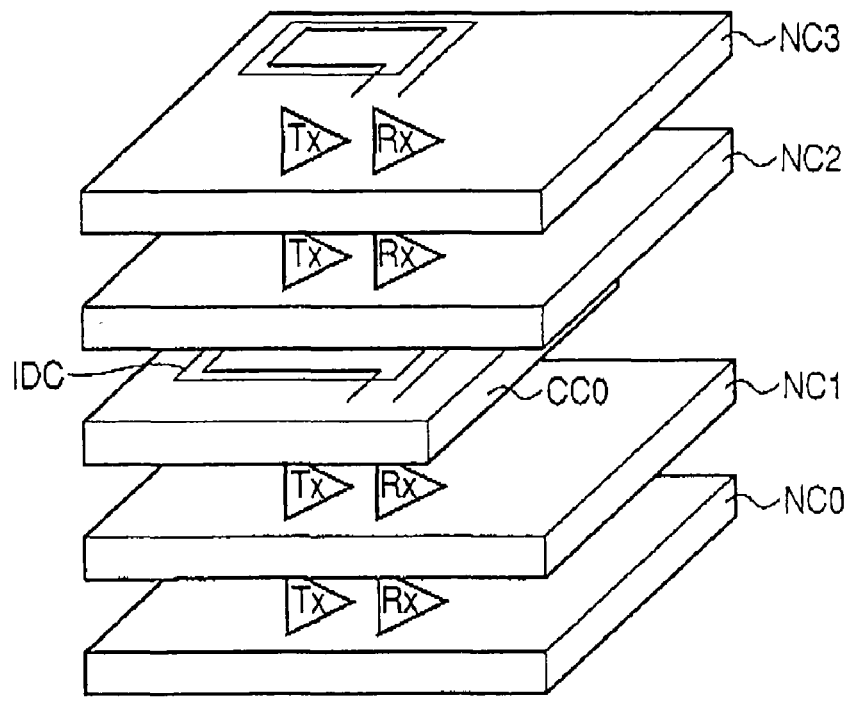
FIG. 16 is a perspective view showing the structure of a nonvolatile semiconductor memory device according to a fourth embodiment.

FIG. 16 is a perspective view showing the structure of a nonvolatile semiconductor memory device according to the fourth embodiment.

As shown in FIG. 16, the nonvolatile semiconductor memory device according to the fourth embodiment comprises a control chip CC0, and NAND chips NC0, NC1, NC2, and NC3. A controller and an inductor element IDC are formed in the control chip CC0.

The four NAND chips NC0, NC1, NC2, and NC3 are stacked in ascending order. The control chip CC0 is disposed in the middle of the stacked four NAND chips, that is, between the second NAND chip NC1 and the third NAND chip NC2.

The NAND chips NC0, NC1, NC2, and NC3 have inductor elements ID0, ID1, ID2, and ID3, respectively. The inductor elements formed in the NAND chips NC0, NC1, NC2, and NC3 and the control chip CC0 are disposed at corresponding positions in the chip stacking direction. Specifically, the centers of openings in the inductor elements are arranged to be on the same line in the stacking direction. Alternatively, the outer peripheries of the inductor elements formed in the NAND chips NC0 to NC3 are included in a closed space produced by extending the outer periphery of the inductor element IDC in a direction perpendicular to a plane that includes the inductor element IDC.

Furthermore, the size of the inductor element IDC of the control chip CC0 is set to be greater than the sizes of the other inductor elements of the other NAND chips NC0, NC1, NC2, and NC3. The number of winds of a conducting wire (conductor) that constitutes the inductor element IDC of the control chip CC0 is set to be greater than the numbers of winds of conducting wires (conductors) that constitute the inductor elements of the other NAND chips NC0, NC1, NC2, and NC3.

Thus, each of the NAND chips NC0, NC1, NC2, and NC3 can communicate with the control chip CC0 by lower power, and the increase in the area of the inductor element of each of the NAND chips can be inhibited. That is, the inductor element IDC of the control chip CC0 is greater in size than the inductor element of each of the NAND chips, or the number of winds of the conductor that constitutes the inductor element IDC is greater than the number of winds of the conductor that constitutes the inductor element of each of the NAND chips. This enables a communication between the control chip CC0 and the NAND chip without increasing the size or the number of winds of the inductor element of the NAND chip.

Such an advantage is also applicable to the other embodiments. That is, by increasing the size or the number of winds of the inductor element of the control chip CC0, a communication between the control chip CC0 and the NAND chip is permitted without increasing the size or the number of winds of the inductor element of the NAND chip.

[4-2] Operation of the Nonvolatile Semiconductor Memory Device

A first operation example of the nonvolatile semiconductor memory device according to the fourth embodiment is described.

A chip address is allocated to each of the NAND chips NC0, NC1, NC2, and NC3 as in the existing NAND memory. The chip addresses, instruction commands and addresses are then transmitted to all of the NAND chips from the control chip CC0.

Initially, all of the NAND chips are in a standby mode, and a corresponding NAND chip is changed to a transmission (read) mode or a receiving (write) mode by the instruction command. The other NAND chips are changed to an off mode.

When the read or write processing is finished in the NAND chip which has changed to the transmission mode or the receiving mode, the control chip CC0 changes all of the NAND chips to the standby mode by a control signal. Data is sent/received between the NAND chips via the control chip CC0.

According to the present embodiment, bonding wires for power supply lines, for controlling a start from the standby mode, and for the chip addresses cannot be eliminated, but the bonding wires can be reduced to several bonding wires per chip. Thus, an inter-chip communication can be performed by the extremely simple operation sequence and configuration.

Moreover, according to the present embodiment, the chip addresses of the NAND chips may be determined at the time of a die sort test. This makes it possible to reduce the bonding wires for the chip addresses formed between the control chip CC0 and the NAND chip.

Now, a second operation example of the nonvolatile semiconductor memory device according to the fourth embodiment is described.

A chip address is allocated to each of the NAND chips NC0, NC1, NC2, and NC3 as in the existing NAND memory. Alternatively, the NAND chips are labeled as in the embodiment described above.

During a communication, control signals are transmitted to all of the NAND chips from the control chip CC0 in the order of a column address, a page address, a plane address, a block address, a chip address, and an instruction command.

In this case, power transmitted from the control chip CC0 is adjusted in accordance with the chip address of the NAND chip in which processing is to be performed. The reason is that it is not desirable from the perspective of power consumption to transmit power to reach all of the NAND chips (the most distant NAND chip) in communicating with the NAND chip closest to the control chip CC0.

On the basis of the address information from the control chip CC0, the corresponding NAND chip is changed to the corresponding operation mode (read/write) by the instruction command. The other NAND chips remain in the standby mode until the corresponding addresses (their addresses) are received. The corresponding NAND chip is changed to the standby mode simultaneously with the end of the processing, and a series of processing is finished.

As described above, according to the present operation example, the bonding wire used to transmit the control signal for recovery from the off mode to the standby mode can be eliminated, and the labeling is combined with the method described above so that the nonvolatile semiconductor memory device having a three-dimensional mounting configuration can be obtained simply by forming the bonding wires for the power supply lines (the power supply voltage VDD and the reference voltage Vss).

Now, a third operation example of the nonvolatile semiconductor memory device according to the fourth embodiment is described.

Figure 17:
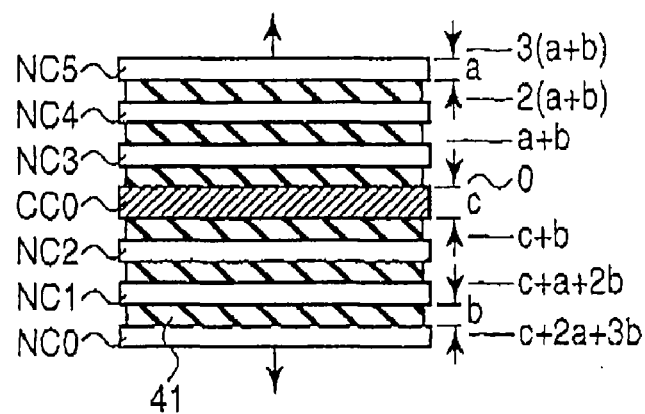
FIG. 17 is a sectional view of a nonvolatile semiconductor memory device according to a modification of the fourth embodiment.

FIG. 17 is a sectional view of a nonvolatile semiconductor memory device according to a modification of the fourth embodiment. In this example, a control chip is disposed between stacked NAND chips.

Here, six NAND chips NC0 to NC5 are stacked in ascending order. A control chip CC0 is disposed in the middle of the stacked six NAND chips, that is, between the third NAND chip NC2 and the fourth NAND chip NC3. An adhesive agent 41 is disposed between the NAND chips and between the NAND chip and the control chip CC0.

In such a structure, if the NAND chips and the control chip are equal in thickness, the distances between the control chip CC0 and the NAND chips disposed above and under the control chip CC0 do not differ. Thus, the thickness of the control chip CC0 is set at c, and the thickness of each NAND chip is set at a. Here, if the thickness of the layer of the adhesive agent 41 is b, the distance between the inductor element of the control chip CC0 and the inductor element of each NAND chip is determined as shown in FIG. 17.

For example, the distance between the inductor element of the control chip CC0 and the inductor element of the NAND chip NC3 is "a+b". Similarly, the distance between the control chip CC0 and the NAND chip NC4 is "2(a+b)", and the distance between the control chip CC0 and the NAND chip NC5 is "3(a+b)".

The distance between the inductor element of the control chip CC0 and the inductor element of the NAND chip NC2 is "c+b". Similarly, the distance between the control chip CC0 and the NAND chip NC1 is "c+a+2b", and the distance between the control chip CC0 and the NAND chip NC0 is "c+2a+3b".

Thus, the distance between the inductor element of the control chip CC0 and the inductor element of each NAND chip is varied, so that conflicts during labeling can be avoided. That is, during labeling, it is possible to avoid a situation in which labeling cannot be normally performed because of interference.

As shown in FIG. 18, in a structure in which NAND chips are stacked, shield layers 42H and 42L may be disposed on the top of the inductor element of an uppermost NAND chip NCH and on the bottom of the inductor element of a lowermost NAND chip NCL, respectively.

In the structure shown in FIG. 18, a magnetic flux through the inductor element does not diverge, and converges toward the shield layers, so that electromotive force generated in the inductor element of a receiving circuit can be increased.

[5] Fifth Embodiment

In the fifth embodiment, a first example of a nonvolatile semiconductor memory device formed by rotating and stacking NAND chips is described.

[5-1] Configuration of the Nonvolatile Semiconductor Memory Device

FIG. 19 is a diagram showing the structure of the nonvolatile semiconductor memory device according to the fifth embodiment. FIG. 20 is a sectional view along the line 20-20 of FIG. 19.

As shown in FIG. 20, a control chip CC0 is disposed on a substrate 55. NAND chips NC0, NC1, NC2, and NC3 are stacked on the control chip CC0 in order from the side of the control chip CC0. An adhesive agent 51 is disposed between the control chip CC0 and the NAND chip NC0 and between the NAND chips NC0, NC1, NC2, and NC3 to bond these chips together.

The control chip CC0, and the NAND chips NC0, NC1, NC2, and NC3 have inductor elements IDC, ID0, ID1, ID2, and ID3, respectively. The inductor elements IDC, ID0, ID1, ID2, and ID3 are disposed at corresponding positions in the chip stacking direction. Specifically, the centers of openings in the inductor elements are arranged to be on the same line in the stacking direction. Alternatively, the outer peripheries of the inductor elements ID0 to ID3 are included in a closed space produced by extending the outer periphery of the inductor element IDC in a direction perpendicular to a plane that includes the inductor element IDC.

As shown in FIG. 19, the inductor element of each NAND chip is formed at a position off the center of the outer shape of the NAND chip. When such NAND chips are rotated 180 degrees and stacked, the memory device shown in FIG. 19 and FIG. 20 can be formed. Although two inductor elements are formed in one chip in the example shown here, one inductor element or three or more inductor elements may be formed in one chip.

A pad 52 is formed on the substrate 55. A pad 53 is formed on the NAND chip. A bonding wire 54 is formed between the pad 52 on the substrate 55 and the pad 53 on the NAND chip to connect these pads.

In other respects, the configuration and operation of the nonvolatile semiconductor memory device according to the fifth embodiment are similar to those described in the first embodiment.

[5-2] Method of Manufacturing the Nonvolatile Semiconductor Memory Device

Now, a method of manufacturing the nonvolatile semiconductor memory device according to the fifth embodiment is described.

FIG. 21A and FIG. 21B are plan views showing the configuration of the NAND chip provided in the nonvolatile semiconductor memory device according to the fifth embodiment.

In the NAND chips NC0, NC1, NC2, and NC3 in which NAND memories are formed, the center of a region where the inductor elements ID are formed is located at an eccentric position off the center of the outer shape of the NAND chip in one direction, as shown in FIG. 21A and FIG. 21B. That is, the centers of two inductor elements ID are located off the center of the NAND chip in one direction.

The NAND chip shown in FIG. 21B is obtained by rotating the NAND chip shown in FIG. 21A 180 degrees on the region where the inductor elements ID are formed. As the center of the region where the inductor elements ID are formed is off the center of the NAND chip, an offset change is made as shown in FIG. 21B.

The NAND chip shown in FIG. 21A and the NAND chip shown in FIG. 21B are stacked to form a memory device having a three-dimensional structure shown in FIG. 19 and FIG. 20. When the memory device having such a structure is formed, the pads 53 on the NAND chips NC0 to NC3 alternate in a direction in which the pads face each other. Thus, a work space for forming a bonding wire between the pads can be secured. As a result, the bonding wire 54 is easily formed between the pad 53 on the NAND chip and the pad 52 on the substrate 55.

[6] Sixth Embodiment

In the sixth embodiment, a second example of a nonvolatile semiconductor memory device formed by rotating and stacking NAND chips is described.

[6-1] Configuration of the Nonvolatile Semiconductor Memory Device

Figure 23:
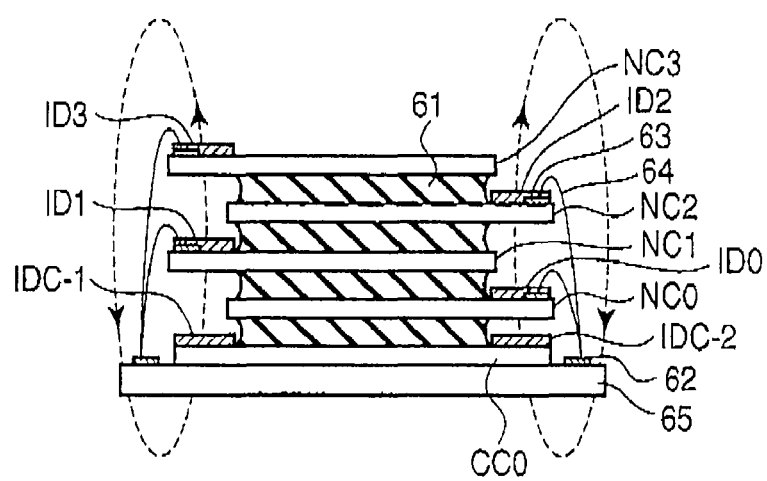
FIG. 23 is a sectional view along the line 23-23 of FIG. 22.

FIG. 22 is a diagram showing the structure of a nonvolatile semiconductor memory device according to the sixth embodiment. FIG. 23 is a sectional view along the line 23-23 of FIG. 22.

As shown in FIG. 23, a control chip CC0 is formed on a substrate 65. NAND chips NC0, NC1, NC2, and NC3 are stacked on the control chip CC0 in order from the side of the control chip CC0. An adhesive agent 61 is disposed between the control chip CC0 and the NAND chip NC0 and between the NAND chips NC0, NC1, NC2, and NC3 to bond these chips together.

The control chip CC0, and the NAND chips NC0, NC1, NC2, and NC3 have inductor elements IDC-1, IDC-2, ID0, ID1, 102, and ID3, respectively.

The inductor elements IDC-1, ID1, and ID3 are disposed at corresponding positions in the chip stacking direction. Specifically, the centers of openings in the inductor elements IDC-1, ID1, and ID3 are arranged to be on the same line in the stacking direction. Alternatively, the outer peripheries of the inductor elements ID1 and ID3 are included in a closed space produced by extending the outer periphery of the inductor element IDC-1 in a direction perpendicular to a plane that includes the inductor element IDC-1.

Similarly, the inductor elements IDC-2, 100, and ID2 are disposed at corresponding positions in the chip stacking direction. Specifically, the centers of openings in the inductor elements IDC-2, ID0, and ID2 are arranged to be on the same line in the stacking direction. Alternatively, the outer peripheries of the inductor elements ID0 and ID2 are included in a closed space produced by extending the outer periphery of the inductor element IDC-2 in a direction perpendicular to a plane that includes the inductor element IDC-2.

As shown in FIG. 22, the inductor element of each NAND chip is formed at a position close to a peripheral corner of the NAND chip. When such NAND chips are rotated 180 degrees and stacked, the memory device shown in FIG. 22 and FIG. 23 can be formed. Although two inductor elements are formed in one chip in the example shown here, one inductor element or three or more inductor elements may be formed in one chip.

A pad 62 is formed on the substrate 65. A pad 63 is formed on the NAND chip. A bonding wire 64 is formed between the pad 62 on the substrate 65 and the pad 63 on the NAND chip to connect these pads.

In other respects, the configuration and operation of the nonvolatile semiconductor memory device according to the sixth embodiment are similar to those described in the first embodiment, and are therefore not described.

[6-2] Method of Manufacturing the Nonvolatile Semiconductor Memory Device

Now, a method of manufacturing the nonvolatile semiconductor memory device according to the sixth embodiment is described.

Figure 24:
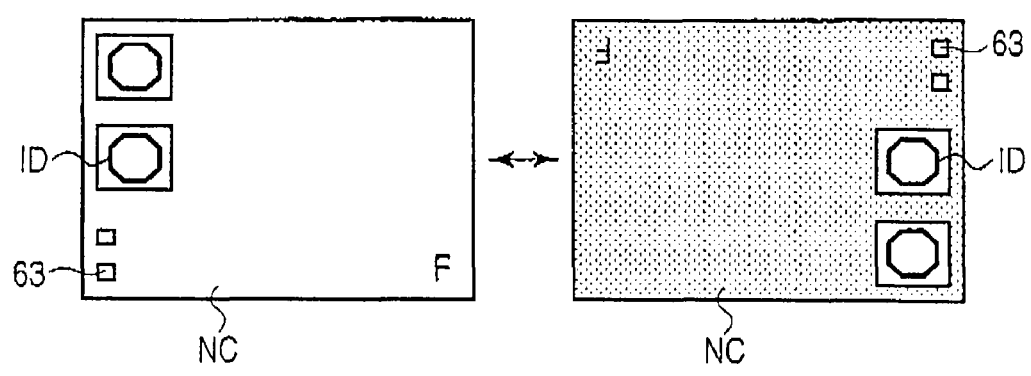
FIG. 24 is a plan view showing the configuration of a NAND chip provided in the nonvolatile semiconductor memory device according to the sixth embodiment.

FIG. 24A and FIG. 24B are plan views showing the configuration of the NAND chip provided in the nonvolatile semiconductor memory device according to the sixth embodiment.

Inductor elements ID are disposed in a peripheral part on one side of each of the NAND chips NC0, NC1, NC2, and NC3 in which NAND flash memories are formed, as shown in FIG. 24A. That is, the centers of two inductor elements ID are located at eccentric positions close to the peripheral corner of the NAND chip. The pad 63 on the NAND chip is formed in a peripheral part on one side of the NAND chip in which the inductor elements are formed.

The NAND chip shown in FIG. 24B is obtained by rotating the NAND chip shown in FIG. 24A 180 degrees on the center of the NAND chip. As the center of the region where the inductor elements ID are formed is located at the corner eccentric position, the inductor elements are located at point-symmetric positions with respect to the center of the NAND chip, as shown in FIG. 24B.

The NAND chip shown in FIG. 24A and the NAND chip shown in FIG. 24B are stacked to form a memory device having a three-dimensional structure shown in FIG. 22 and FIG. 23. When the memory device having such a structure is formed, the pads 63 on the NAND chips NC0 to NC3 alternate in a direction in which the pads face each other. Thus, a work space for forming a bonding wire between the pads can be secured. As a result, the bonding wire 64 is easily formed between the pad 63 on the NAND chip and the pad 62 on the substrate 65.

Furthermore, a first channel is formed by the inductor element IDC-1 of the control chip CC0 and the inductor elements ID1 and ID3 of the odd NAND chips NC1 and NC3. Similarly, a second channel is formed by the inductor element IDC-2 of the control chip CC0 and the inductor elements ID0 and ID2 of the even NAND chips NC0 and NC2. As a result, a memory device having a dual channel can be formed.

[7] Advantages of the Embodiments

According to the embodiments, the transmission/receiving circuits are provided to perform an inter-chip communication by inductive coupling between the inductor elements of the chips. By using a common inductor element in the transmission/receiving circuits, an increase of chip area can be prevented. Moreover, the inductor element of the control chip is greater in size or in the number of winds than the inductor element of each of the other NAND chips. As a result, power necessary for the memory chips in transmission/receiving can be reduced, and the increase of the area of each memory chip attributed to the formation of the inductor element can be inhibited. Further, according to the embodiments, it is possible to provide an asynchronous communication system having an extremely simple configuration that requires no clock signal.

As described above, according to the embodiments, it is possible to provide a nonvolatile semiconductor memory device having a high-speed interface which can inhibit an obvious increase in the number of wire bondings when the number of stacked chips is increased and which can also inhibit an increase of chip area attributed to the formation of the inductor element.

According to the embodiments, it is possible to provide a solid-state image sensing device capable of securing a sufficient number of saturated electrons and also capable of high-speed read operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a first memory chip which comprises a first inductor element configured to transmit/receive a signal, and a memory cell;
   a second memory chip which is disposed on the first memory chip and which comprises a second inductor element configured to transmit/receive a signal, and a memory cell; and
   a control chip which comprises a control circuit configured to control the operations of the first and second memory chips, and a third inductor element configured to transmit/receive a signal to/from the first and second inductor elements,
   wherein the outer peripheries of the first and second inductor elements are included in a closed space produced by extending the outer periphery of the third inductor element in a direction perpendicular to a plane that includes the third inductor element, and
   the inductance of the third inductor element greater than at least one of the inductances of the first and second inductor elements.

2. The nonvolatile semiconductor memory device according to claim 1, wherein
   the size of the third inductor element is greater than at least one of the sizes of the first and second inductor elements.

3. The nonvolatile semiconductor memory device according to claim 1, wherein
   the number of winds of a conductor that forms the third inductor element is greater than at least one of the numbers of winds of conductors that form the first and second inductor elements.

4. The nonvolatile semiconductor memory device according to claim 1, wherein
   the first memory chip comprises
   a first transmission circuit configured to transmit a signal by the first inductor element,
   a first receiving circuit configured to receive a signal by the first inductor element, and
   a first switch circuit configured to connect the first inductor element and one of the first transmission circuit and the first receiving circuit,
   the second memory chip comprises
   a second transmission circuit configured to transmit a signal by the second inductor element,
   a second receiving circuit configured to receive a signal by the second inductor element, and
   a second switch circuit configured to connect the second inductor element and one of the second transmission circuit and the second receiving circuit, and
   the control chip comprises
   a third transmission circuit configured to transmit a signal by the third inductor element,
   a third receiving circuit configured to receive a signal by the third inductor element, and
   a third switch circuit configured to connect the third inductor element and one of the third transmission circuit and the third receiving circuit.

5. The nonvolatile semiconductor memory device according to claim 1, wherein
   the control chip is disposed between the first memory chip and the second memory chip.

6. The nonvolatile semiconductor memory device according to claim 1, wherein
   the control chip is disposed on the second memory chip.

7. The nonvolatile semiconductor memory device according to claim 1, wherein
   the first memory chip, the second memory chip, and the control chip are stacked to form a stack structure, and
   shield layers are further provided across the stack structure.

8. A nonvolatile semiconductor memory device comprising:
   a substrate which comprises a first inductor element configured to transmit/receive a signal, and a terminal configured to externally input/output a signal;
   a first memory chip which is disposed on the substrate and which comprises a second inductor element configured to transmit/receive a signal, and a memory cell;
   a second memory chip which is disposed on the first memory chip and which comprises a third inductor element configured to transmit/receive a signal, and a memory cell; and
   a control chip which is disposed between the substrate and the first memory chip and which comprises a control circuit configured to control the operations of the first and second memory chips, and a fourth inductor element configured to transmit/receive a signal,
   wherein the first inductor element transmits/receives a signal to/from the second, third and fourth inductor elements.

9. The nonvolatile semiconductor memory device according to claim 8, wherein
   the outer peripheries of the second, third and fourth inductor elements are included in a closed space produced by extending the outer periphery of the first inductor element in a direction perpendicular to a plane that includes the first inductor element.

10. The nonvolatile semiconductor memory device according to claim B, wherein
    the inductance of the first inductor element is greater than at least one of the inductances of the second, third and fourth inductor elements.

11. The nonvolatile semiconductor memory device according to claim 8, wherein
the size of the first inductor element is greater than at least one of the sizes of the second, third and fourth inductor elements.

12. The nonvolatile semiconductor memory device according to claim 8, wherein
the number of winds of a conductor that forms the first inductor element is greater than at least one of the numbers of winds of conductors that form the second, third and fourth inductor elements.

13. The nonvolatile semiconductor memory device according to claim 8, wherein
the substrate comprises
a first transmission circuit configured to transmit a signal by the first inductor element,
a first receiving circuit configured to receive a signal by the first inductor element, and
a first switch circuit configured to connect the first inductor element and one of the first transmission circuit and the first receiving circuit,
the first memory chip comprises
a second transmission circuit configured to transmit a signal by the second inductor element,
a second receiving circuit configured to receive a signal by the second inductor element, and
a second switch circuit configured to connect the second inductor element and one of the second transmission circuit and the second receiving circuit,
the second memory chip comprises
a third transmission circuit configured to transmit a signal by the third inductor element,
a third receiving circuit configured to receive a signal by the third inductor element, and
a third switch circuit configured to connect the third inductor element and one of the third transmission circuit and the third receiving circuit, and
the control chip comprises
a fourth transmission circuit configured to transmit a signal by the fourth inductor element,
a fourth receiving circuit configured to receive a signal by the fourth inductor element, and
a fourth switch circuit configured to connect the fourth inductor element and one of the fourth transmission circuit and the fourth receiving circuit.

14. A nonvolatile semiconductor memory device comprising:
a first memory chip which comprises a first inductor element configured to transmit/receive a signal, and a memory cell;
a second memory chip which is disposed on the first memory chip and which comprises a second inductor element configured to transmit/receive a signal, and a memory cell;
a substrate which is disposed on the second memory chip and which comprises a third inductor element configured to transmit/receive a signal to/from the first and second inductor elements, and a first terminal connected to the third inductor element; and
a control chip which is disposed on the second memory chip and which comprises a control circuit configured to control the operations of the first and second memory chips, and a second terminal electrically connected to the first terminal.

15. The nonvolatile semiconductor memory device according to claim 14, wherein
the outer peripheries of the first and second inductor elements are included in a closed space produced by extending the outer periphery of the third inductor element in a direction perpendicular to a plane that includes the third inductor element.

16. The nonvolatile semiconductor memory device according to claim 14, wherein
the inductance of the third inductor element is greater than at least one of the inductances of the second and third inductor elements.

17. The nonvolatile semiconductor memory device according to claim 14, wherein
the size of the third inductor element is greater than at least one of the sizes of the first and second inductor elements.

18. The nonvolatile semiconductor memory device according to claim 14, wherein
the number of winds of a conductor that forms the third inductor element is greater than at least one of the numbers of winds of conductors that form the first and second inductor elements.

19. The nonvolatile semiconductor memory device according to claim 14, wherein
the first memory chip comprises
a first transmission circuit configured to transmit a signal by the first inductor element,
a first receiving circuit configured to receive a signal by the first inductor element, and
a first switch circuit configured to connect the first inductor element and one of the first transmission circuit and the first receiving circuit,
the second memory chip comprises
a second transmission circuit configured to transmit a signal by the second inductor element,
a second receiving circuit configured to receive a signal by the second inductor element, and
a second switch circuit configured to connect the second inductor element and one of the second transmission circuit and the second receiving circuit, and
the substrate comprises
a third transmission circuit configured to transmit a signal by the third inductor element,
a third receiving circuit configured to receive a signal by the third inductor element, and
a third switch circuit configured to connect the third inductor element and one of the third transmission circuit and the third receiving circuit.

20. The nonvolatile semiconductor memory device according to claim 14, wherein
the first memory chip, the second memory chip, the substrate, and the control chip are stacked to form a stack structure, and
shield layers are further provided across the stack structure.

* * * * *